(12) United States Patent
Koganei

(10) Patent No.: US 6,518,170 B2
(45) Date of Patent: Feb. 11, 2003

(54) METHOD OF MANUFACTURING A SEMICONDUCTOR DEVICE

(75) Inventor: Hirosada Koganei, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/884,074

(22) Filed: Jun. 20, 2001

(65) Prior Publication Data

US 2002/0013046 A1 Jan. 31, 2002

(30) Foreign Application Priority Data

Jun. 21, 2000 (JP) ........................................ 2000-186910

(51) Int. Cl.⁷ ........................................... H01L 21/4763
(52) U.S. Cl. ..................... 438/623; 438/624; 438/628; 438/778; 438/780; 438/782; 438/787; 438/790; 438/791
(58) Field of Search .................. 438/622–624, 438/628, 778, 780–782, 787–789, 790–794, 761

(56) References Cited

U.S. PATENT DOCUMENTS

| | | | | |
|---|---|---|---|---|
| 5,023,205 A | * | 6/1991 | Reche ........................ 437/228 |
| 6,077,792 A | * | 6/2000 | Farrar ........................ 438/780 |
| 6,086,679 A | * | 7/2000 | Lee et al. ................... 118/724 |
| 6,140,456 A | * | 10/2000 | Lee et al. ................... 528/196 |
| 6,239,019 B1 | * | 5/2001 | Chiang et al. .............. 438/624 |
| 6,258,407 B1 | * | 7/2001 | Lee et al. ............. 427/255.28 |
| 6,309,956 B1 | * | 10/2001 | Chiang et al. .............. 438/622 |
| 6,323,297 B1 | * | 11/2001 | Lee et al. ................... 526/251 |
| 2001/0029110 A1 | * | 10/2001 | Lee et al. ................... 438/780 |
| 2001/0049912 A1 | * | 12/2001 | Motonari et al. ............. 51/307 |
| 2002/0064935 A1 | * | 5/2002 | Honda ........................ 438/622 |

* cited by examiner

Primary Examiner—John F. Niebling
Assistant Examiner—Lynne A. Gurley
(74) Attorney, Agent, or Firm—Sughrue Mion, PLLC

(57) ABSTRACT

A semiconductor device has an interlayer insulation film formed on a first metal wiring and formed of an organic compound having a lower dielectric constant than that of $SiO_2$, a second metal wiring formed on the interlayer insulation film, and an interlayer adhesion layer to improve adherence between the interlayer insulation film and the second metal wiring. The semiconductor device is provided with a stress buffer layer of which the elastic modulus is higher than that of the interlayer insulation film and is lower than that of the interlayer adhesion layer between the interlayer insulation film and the interlayer adhesion layer.

3 Claims, 5 Drawing Sheets

METHOD OF MANUFACTURING A SEMICONDUCTOR DEVICE

BACKGROUND OF THE INVENTION

1. Technical Field of the Invention

The present invention relates to a semiconductor device and a method of manufacturing the same, and more particularly to a semiconductor device having an interlayer insulation film having a lower dielectric constant than that of $SiO_2$ and the method of manufacturing the same.

2. Description of the Related Art

To accomplish high speed and high integration of LSI, delay of a signal transmission speed caused by an electric capacity between wirings and between interlayer insulation films has been a problem. In this regard, particularly in recent years, studies aiming for a low dielectric constant of an interlayer insulation film have progressed, and for example, organic compounds such as polyimide polymer, bisbenzocyclobutene siloxane polymer (hereinafter referred to as "BCB") are used as an interlayer insulation film. A specific dielectric constant of such organic compounds is about 1.5 to 2.5, and is greatly lower than that (about 4) of the conventional interlayer insulation film mainly formed of $SiO_2$. In addition, it is possible that these organic compounds are easily deposited by spin coating and sintering and are deposited flat regardless of undulation of a base structure.

However, in the case of forming an interlayer insulation film by the organic compounds, adherence to a metal used in wiring is weak, and the exfoliation tends to occur. Thus, in order to improve the adherence, an interlayer adhesion layer has been provided between the interlayer insulation film by the organic compounds and the wiring. For example, in case of using BCB as an interlayer insulation film, SiN and the like are used as an interlayer adhesion layer. Hereinafter, using this embodiment, a structure of a semiconductor device will be explained with the manufacturing method thereof.

FIG. 1 is a cross sectional view showing GaAs-IC using BCB as an interlayer insulation film, in method of manufacturing the GaAs-IC, first, a first metal wiring 102 formed of Au, etc. and including a device section such as FET is formed on a GaAs substrate 101 by sputtering method and dry etching method. Next, a first interlayer adhesion layer 103 formed of SiN is formed, for example, by plasma CVD method, etc. However, the first interlayer adhesion layer 103 can be omitted in case where sufficient adherence is obtained between the first metal wiring 102 and an interlayer insulation film 104 explained later.

Next, the interlayer insulation film 104 is formed of BCB and in the thickness of 1,000 to 20,000 nm, for instance, by the steps of coating BCB in a desired thickness, and then, sintering and hardening the BCB under $N_2$ atmosphere at a temperature of 300° C. Then, a second interlayer adhesion layer 106 is formed of SiN by plasma CVD method. Next, a through hole 110 is formed by means of dry etching using a photoresist mask (not shown). For example, SiN is etched by RIE using a mixed gas of $CF_4$ and $H_2$, and BCB is etched by RIE using a mixed gas of $CF_4$ and $O_2$. After that, a second metal wiring 108 formed of Au, etc. is formed by sputtering method, etc. Also, a protection layer (not shown) is formed to protect the second metal wiring 108. The protection layer is formed of SiN and the like, which have excellent adherence to the second metal wiring 108.

In addition, if the thickness of the SiN layer used in the interlayer adhesion layer 103 and the protection layer 109 is thick, it causes the specific dielectric constant to rise, thereby, it is desirable to form the SiN layer to be about 50 to 100 nm as thin as possible.

By the above-mentioned structure, an interlayer insulation film in a semiconductor device can accomplish a low dielectric constant while maintaining excellent adherence to a metal wiring. However, there is a big difference in a mechanical characteristic between the organic compound used as an interlayer insulation film and a material such as SiN used as an interlayer adhesion layer. For example, regarding an interlayer insulation film of 5 $\mu$m in thickness using BCB and an interlayer adhesion layer of 0.3 $\mu$m in thickness using SiN, the stress and elastic modulus thereof are shown in Table 1. In Table 1, a mark "+" and a mark "−" added to the numerical value indicate a tensile stress and a Compressive stress, respectively, and BCB and SiN have the tensile stress and the compressive stress, respectively. Also, there is a large difference in the elastic modulus between BCB and SiN. Accordingly, in case of stacking the both, a strong stress occurs in the interface between them, so that brittle fracture tends to occur in the SiN side having higher elastic modulus, and reliability of the semiconductor device is greatly damaged.

TABLE 1

|  | BCB (organic film) (5 $\mu$m) | SiN (the second film) (0.3 $\mu$m) |
|---|---|---|
| Stress (MPa) | +37 | −540 |
| Elastic modulus (GPa) | 2 | 320 |

SUMMARY OF THE INVENTION

An object of the present invention is to provide a semiconductor device using an organic compound having a lower dielectric constant than that of $SiO_2$ as an interlayer insulation film which has high reliability without fracture by stress concentration while maintaining adherence between said interlayer insulation film and the metal wiring and method of manufacturing the same.

According to one aspect of the present invention, there is provided a semiconductor device comprising: a first metal wiring; an interlayer insulation film formed on the metal wiring and formed of an organic compound having a lower dielectric constant than that of $SiO_2$; a second metal wiring formed on said interlayer insulation film; an interlayer adhesion layer formed to improve adherence between said interlayer insulation film and said second metal wiring; and a stress buffer layer formed between said interlayer insulation film and said interlayer adhesion layer and having the elastic modulus higher than that of said interlayer insulation film and lower than that of said interlayer adhesion layer.

According to the semiconductor device of the present invention, it is preferred that said interlayer insulation film is formed of a bisbenzocyclobutene siloxane polymer and said interlayer adhesion layer is formed of SiN, said stress buffer layer being formed of $SiO_2$, With this, in the semiconductor device using an organic compound as an interlayer insulation film, it is possible to prevent brittle fracture by the stress concentration while maintaining adherence between the metal wiring and the interlayer insulation film, so that reliability of the semiconductor device is improved.

According to another aspect of the present invention, there is provided a method of manufacturing a semiconductor device comprising the steps of: forming an interlayer adhesion layer on a first metal wiring; forming a stress buffer layer of which the elastic modulus is lower than that of said interlayer adhesion layer on said interlayer adhesion layer; forming an interlayer insulation film of which the elastic modulus is lower than that of said stress buffer layer and which is formed of an organic compound having a lower dielectric constant than that of $SiO_2$ on said stress buffer layer; and forming a second metal wiring on said interlayer insulation film. With this, in the semiconductor device using an organic compound as an interlayer insulation film, it is possible to prevent brittle fracture by the stress concentration while maintaining adherence between the metal wiring and the interlayer insulation film, so that reliability of the semiconductor device is improved.

According to the method of manufacturing the semiconductor device of the present invention, it is preferred that said stress buffer layer is formed by any one of thermal CVD method, plasma CVD method and optical CVD method. With this, in the semiconductor device using an organic compound as an interlayer insulation film, it is possible to prevent brittle fracture by the stress concentration while maintaining adherence between the metal wiring and the interlayer insulation film, so that reliability of the semiconductor device is improved.

According to the method of manufacturing the semiconductor device of the present invention, it is preferred that said interlayer insulation film is a bisbenzocyclobutene siloxane polymer film formed by sequentially performing spin coating, and sintering and hardening steps and said interlayer adhesion layer is SiN film formed by any one of thermal CVD method, plasma CVD method and optical CVD method, said stress buffer layer being $SiO_2$ film formed by any one of thermal CVD method, plasma CVD method and optical CVD method. With this, in the semiconductor device using an organic compound as an interlayer insulation film, it is possible to prevent brittle fracture by the stress concentration while maintaining adherence between the metal wiring and the interlayer insulation film, so that reliability of the semiconductor device is improved.

BRIEF DESCRIPTION OF TEE DRAWINGS

The above objects, other objects, features and advantages of the present invention will be better understood from the following description taken in conjunction with the accompanying drawings, in which.

DETAILED DESCRIPTION OF THE PREFERRED EMBODIMENTS

Hereinafter, a semiconductor device and a method of manufacturing the same according to the embodiments of the present invention will be described in detail with reference to the accompanying drawings.

The first embodiment of the present invention will be explained below FIGS. 2A through 2F show a semiconductor device according to the first embodiment of the present invention, and are cross sectional views sequentially showing a constitution of GaAs-IC using BCB as an interlayer insulation film.

Figure 1:
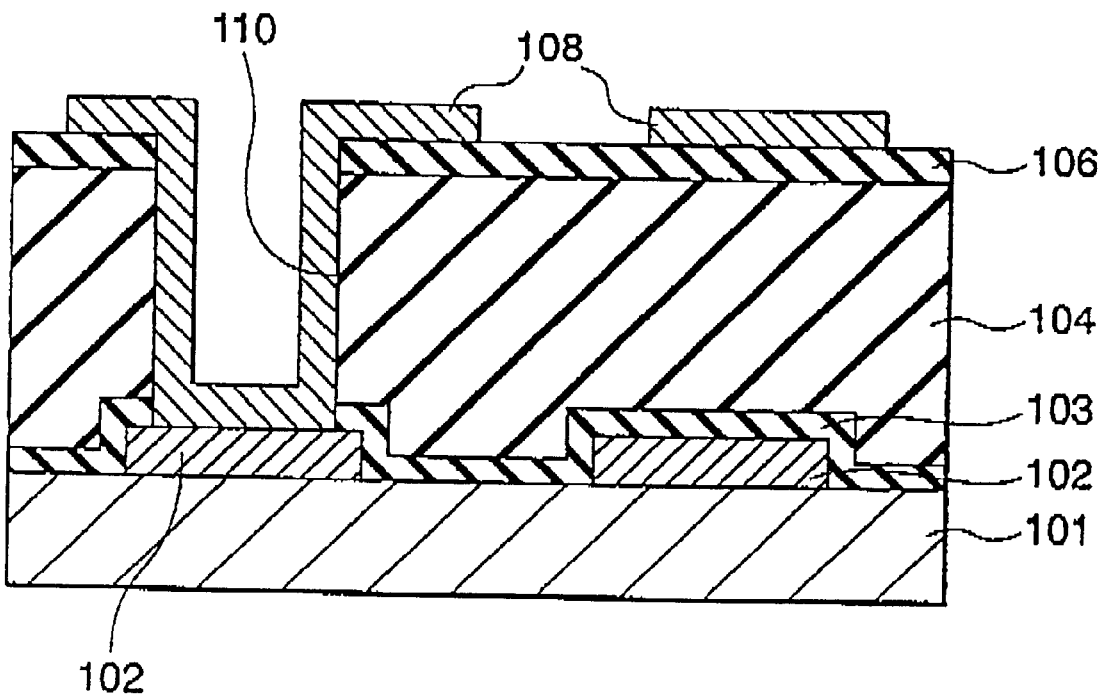
FIG. 1 is a cross sectional view showing an embodiment of a semiconductor device according to the prior art.
Figure 2A:
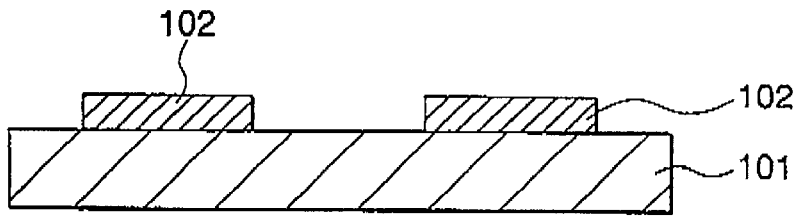
FIGS. 2A through 2F are cross sectional views sequentially showing a method of manufacturing a semiconductor device according to the first embodiment of the present invention.
Figure 2B:
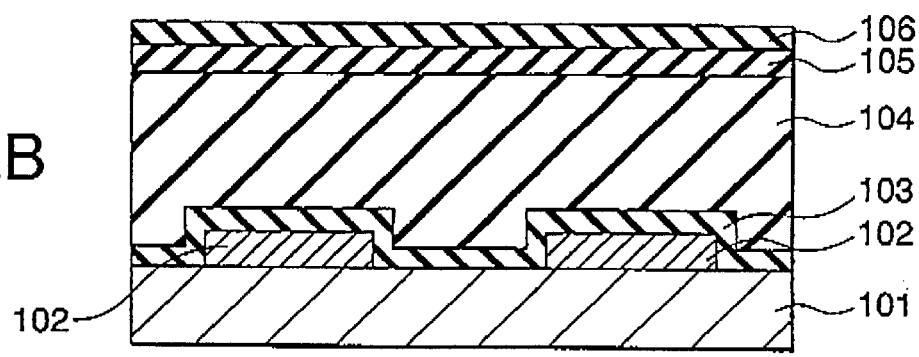
Figure 2C:
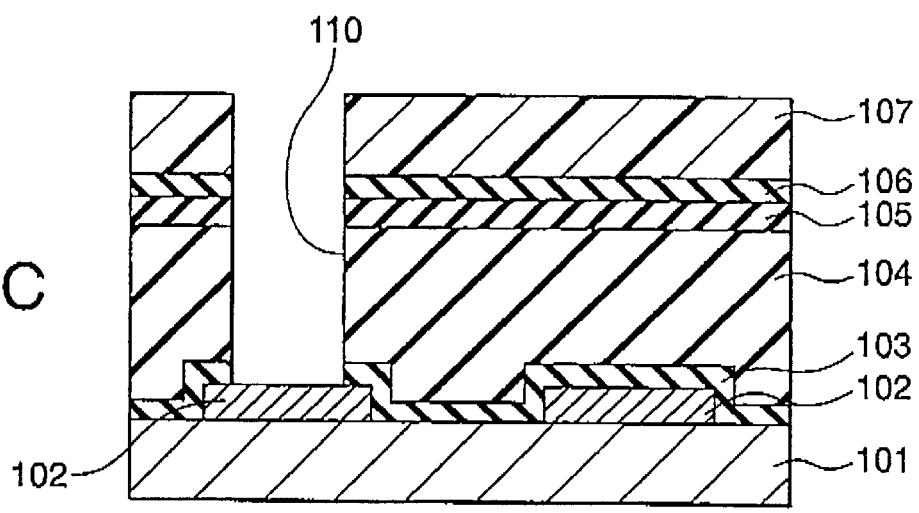
Figure 2D:
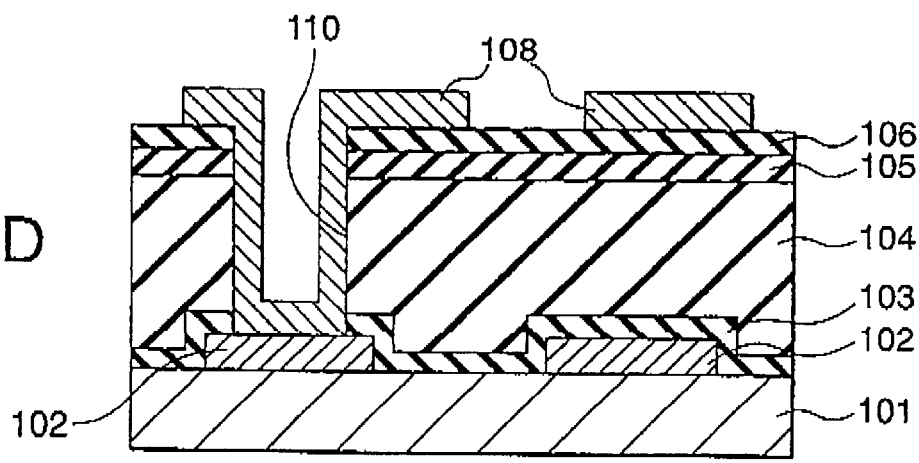
Figure 2E:
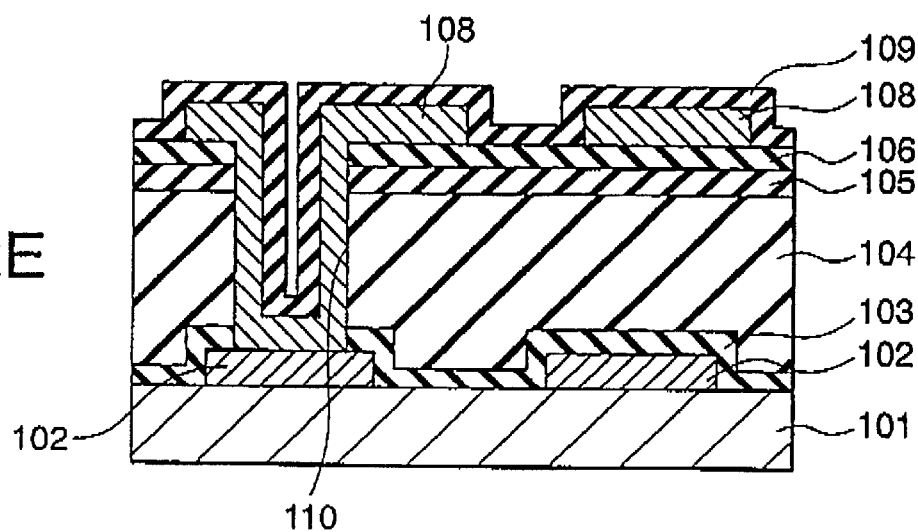
Figure 2F:
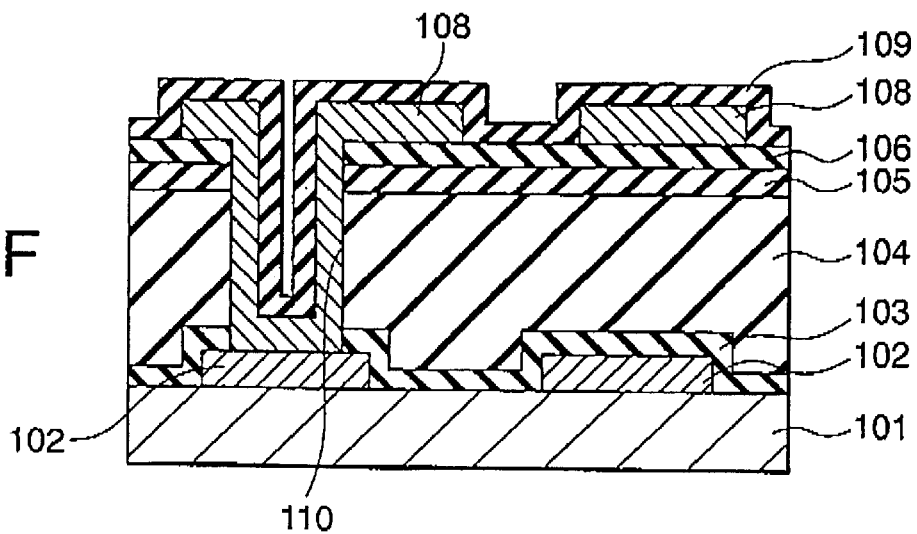

Referring to FIG. 2E, a first metal wiring 102 including a device section such as FET, a first interlayer adhesion layer 103, an interlayer insulation film 104 formed of BCB in the thickness of about 1,000 to 20,000 nm which has a lower dielectric constant than that of $SiO_2$, a stress buffer layer 105, a second interlayer adhesion layer 106, a second metal wiring 108, and a protection layer 109 are sequentially stacked on a GaAs substrate 101. The first metal wiring 102 and the second metal wiring 108 are formed of Au, etc. Also, the first interlayer adhesion layer 103, the second interlayer adhesion layer 106 and the protection layer 109 are formed of SiN, etc. having excellent adherence to a metal. Further, when the thickness thereof is too thick, it causes the specific dielectric constant to rise, thereby, it is preferable that the layers are as thin as possible within the range where sufficient adherence is obtained, and particularly, the thickness is preferable to be about 50 to 100 nm.

The stress buffer layer 105 is a layer provided to buffer a stress caused by the difference of the elastic modulus between the interlayer insulation film 104 (BCB) and the second interlayer adhesion layer 106 (SiN). Accordingly, the material of which the elastic modulus is higher than that of the interlayer insulation film 104 (BCB) and lower than that of the second interlayer adhesion layer 106 (SiN), for example, $SiO_2$ is adequate. In addition, the stress buffer layer 105 is preferable to be about 100 to 500 nm in thickness so as to sufficiently buffer the stress and not to cause fracture therein. Referring to Table 2, $SiO_2$ film of 0.3 μm causes compressive stress like SiN film, but its elastic modulus is lower than that of the SiN film and higher than that of the BCB film. Accordingly, by using the $SiO_2$ layer as a stress buffer layer 105, the brittle fracture in the second interlayer adhesion layer 106 (SiN) which has been a problem conventionally is prevented, so that the reliability of the semiconductor device can be improved.

TABLE 2

|  | BCB (organic film) (5 μm) | SiN (second film) (0.3 μm) | $SiO_2$ (buffer layer) (0.3 μm) |
| --- | --- | --- | --- |
| Stress (MPa) | +37 | −540 | −570 |
| Elastic modulus (GPa) | 2 | 320 | 70 |

Next, a manufacturing method of the semiconductor device according to the present invention will be described below with reference to FIGS. 2A through 2F. As shown in FIG. 2A, the first metal wiring 102 is formed on a GaAs substrate 101. The first metal wiring 102 is formed of a material such as Au, and for instance, is deposited by sputtering method, etc., and then, may be formed by performing a dry etching using a photolithography technology. Next, a first interlayer adhesion layer 103 is formed so as to maintain adherence between the first metal wiring 102 and an interlayer insulation film 104 explained later. For example, SiN is adequate for the first interlayer adhesion layer 103, and may be formed by plasma CVD method. In addition, in case where sufficient adherence is obtained between the first metal layer 102 and the interlayer insulation film 104, the first interlayer adhesion layer 103 may be omitted.

Next, an interlayer insulation film 104 is formed of BCB. First, BCB is made in a desirable thickness by spin coating method, and then, for example, is hardened by a sintering step under $N_2$ atmosphere at a temperature of 300° C. The surface of the BCB film formed as such becomes flat regardless of base substrate shape and unevenness.

Next, a stress buffer layer 105 is formed. $SiO_2$ is adequate for the stress buffer layer 105, and may be formed by plasma CVD method. Then, as shown in FIG. 2B, a second interlayer adhesion layer 106 is formed. For instance, SiN is adequate for the second interlayer adhesion layer 106, and may be formed by plasma CVD method, etc.

Next, as shown in FIG. 2C, a through hole 110 is formed by sequentially dry-etching the second interlayer adhesion layer 106, the stress buffer layer 105, the interlayer insulation film 104 and the first interlayer adhesion layer 103 using a photoresist mask 107. For example, dry etching of SiN and $SiO_2$ can be performed by RIE using a mixed gas of $CF_4$ and $H_2$, and dry etching of BCB can be performed by RIE using a mixed gas of $CF_4$ and $O_2$.

Next, as shown in FIG. 2D, after removing the photoresist mask 107, a second metal wiring 108 is formed, and as shown in FIG. 2E, a protection layer 109 protecting the second metal wiring is formed, so that the GaAs-IC according to the first embodiment of the semiconductor device of the present invention is manufactured.

Figure 3:
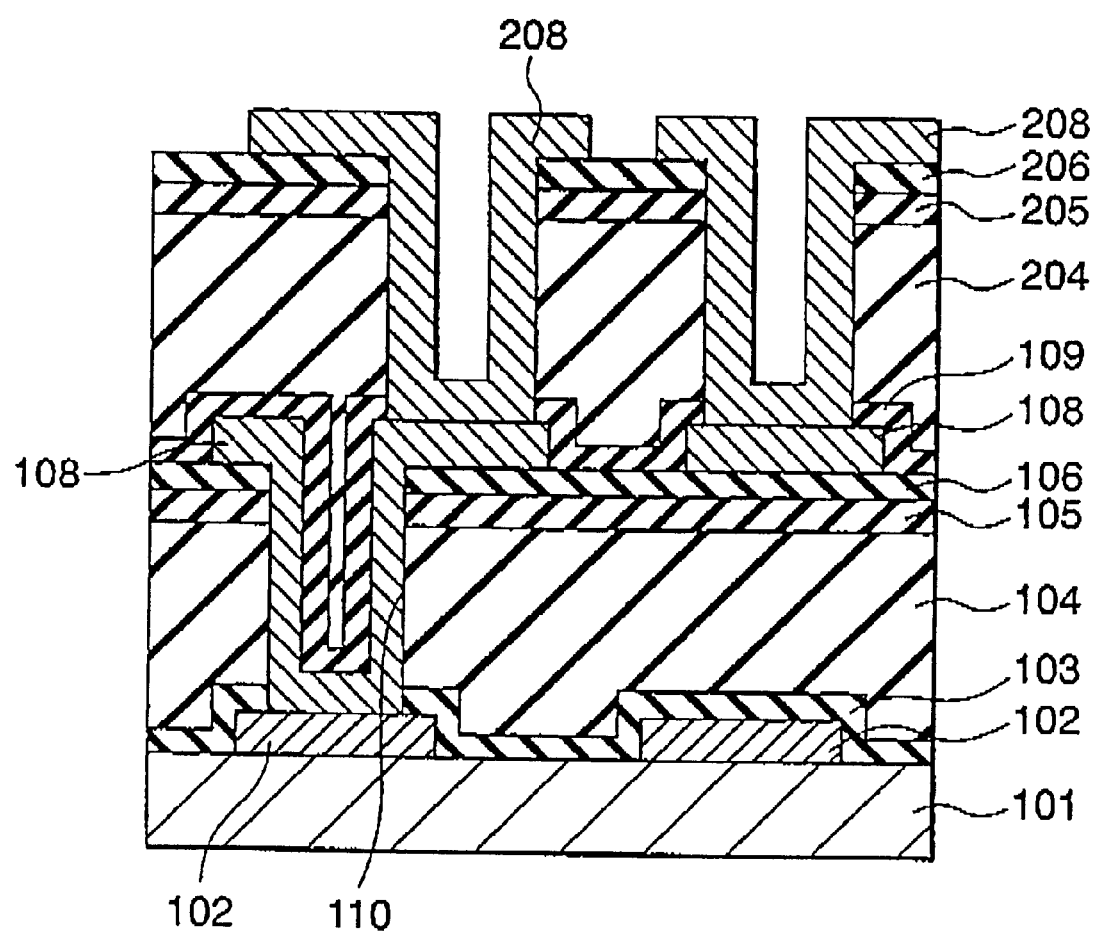
FIG. 3 is a cross sectional view showing a semiconductor device according to the second embodiment of the present invention.

Next, a second embodiment of the present invention will be described. In the present embodiment, as shown in FIG. 3, an upper wiring is further stacked on the semiconductor device according to the first embodiment. As shown in the first embodiment, it is possible that an interlayer insulation film formed of BCB and an interlayer adhesion layer formed of SiN are stacked, and as a result, the interlayer insulation film of BCB can be easily made in a multilayer form. In addition, since the manufacturing method of a semiconductor device shown in FIG. 3 is the same as that of the first embodiment, the explanation thereof will be omitted. Further, it is needless to say that an upper wiring can be further stacked on the semiconductor device shown in FIG. 3.

Figure 4:
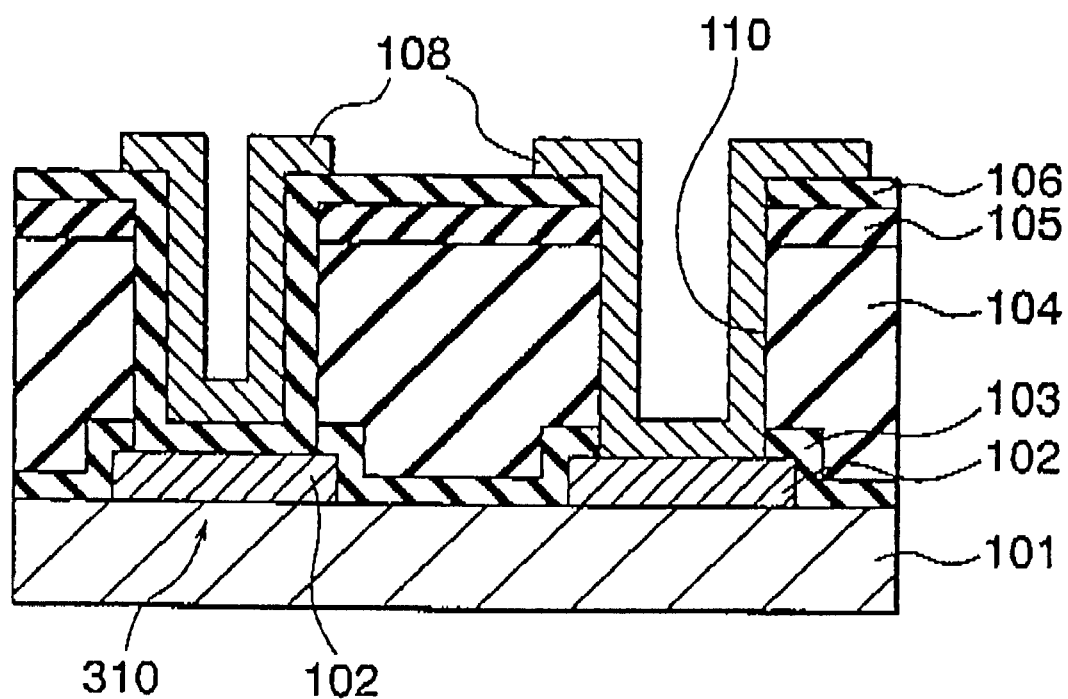
FIG. 4 is a cross sectional view showing a semiconductor device according to the third embodiment of the present invention.

Next, a third embodiment of the present invention will be explained. In addition, the present invention is not limited to the GaAs-IC shown here, and for example, similarly to a semiconductor device according to the third embodiment shown in FIG. 4, it is needless to say that the present invention can be applied to not only a semiconductor device having constitution that SiN film is acting as a capacitor in a capacitor portion 310 and a second interlayer adhesion layer 106 in other places, but also a semiconductor device having other constitution that an organic compound is used as an interlayer staking layer. Further, in case where organic compounds other than DCD, for example, polyimide compound, etc. are used as an interlayer insulation film, the same effect can be obtained by providing a stress buffer layer between the interlayer insulation film and the interlayer adhesion layer, wherein the elastic modulus of the stress buffer layer is between those of the interlayer insulation film and the interlayer adhesion layer.

According to the present invention as described above, it is possible to provide the semiconductor device using an organic compound of a low dielectric constant as an interlayer insulation film which has high reliability without fracture by the stress concentration while maintaining adherence to the metal wiring and the method of manufacturing the same.

Although the technical spirits of the present invention has been disclosed with reference to the appended drawings and the preferred embodiments of the present invention corresponding to the drawings, the descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A method of manufacturing a semiconductor device, comprising the steps of:
    forming an interlayer adhesion layer on a first metal wiring;
    forming a stress buffer layer of which the elastic modulus is lower than that of said interlayer adhesion layer on said interlayer adhesion layer;
    forming an interlayer insulation film of which the elastic modulus is lower than that of said stress buffer layer and which is formed of an organic compound having a lower dielectric constant than that of $SiO_2$ on said stress buffer layer; and
    forming a second metal wiring on said interlayer insulation film.

2. A method of manufacturing a semiconductor device according to claim 1, wherein said stress buffer layer is formed of any one of thermal CVD method, plasma CVD method and optical CVD method.

3. A method of manufacturing a semiconductor device according to claim 1, wherein said interlayer insulation film is bisbenzocyclobutene siloxane polymer film formed by sequentially performing spin coating, and sintering and hardening steps and said interlayer adhesion layer is SiN film formed by any one of thermal CVD method, plasma CVD method and optical CVD method, said stress buffer layer being $SiO_2$ film formed by any one of thermal CVD method, plasma CVD method and optical CVD method.

* * * * *

UNITED STATES PATENT AND TRADEMARK OFFICE
CERTIFICATE OF CORRECTION

PATENT NO.     : 6,518,170 B2
DATED          : February 11, 2003
INVENTOR(S)    : Hirosada Koganei It is certified that error appears in the above-identified patent and that said Letters Patent is hereby corrected as shown below:

Column 5,
Line 53, please delete "DCD" and insert -- BCB --

Signed and Sealed this

Twenty-ninth Day of July, 2003

JAMES E. ROGAN
*Director of the United States Patent and Trademark Office*